United States Patent [19]

Rabeler et al.

[11] 4,017,676
[45] Apr. 12, 1977

[54] CIRCUIT ARRANGEMENT FOR SEPARATING VIDEO AND AUDIO SIGNALS

[75] Inventors: Thorwald Rabeler; Wolfgang Weltersbach, both of Hamburg, Germany

[73] Assignee: U.S. Philips Corporation, New York, N.Y.

[22] Filed: Oct. 24, 1975

[21] Appl. No.: 625,642

[30] Foreign Application Priority Data

Aug. 16, 1975 Germany .......................... 2536496

[52] U.S. Cl. ................................ 358/196; 358/197
[51] Int. Cl.² ........................ H04N 5/44; H04N 5/62
[58] Field of Search ..................... 178/5.8 A, 5.8 R

[56] References Cited

UNITED STATES PATENTS 2,886,633    5/1959    Parmet .......................... 178/5.8 A

*Primary Examiner*—Robert L. Richardson
*Attorney, Agent, or Firm*—Frank R. Trifari; Henry I. Steckler

[57] ABSTRACT

A filter circuit for separating video and audio signals has an extra resistive element added. This forms a bridge circuit that greatly increases the attenuation of the audio signal in the video channel.

10 Claims, 3 Drawing Figures

CIRCUIT ARRANGEMENT FOR SEPARATING VIDEO AND AUDIO SIGNALS

The invention relates to a circuit arrangement for decoupling the video signal from an intercarrier sound signal in a television receiver, in which a first output impedance, from which the video signal can be obtained is connected to the signal source via a sound trap which is tuned to the intermediate frequency of the intercarrier sound signal, a second output impedance from which the intercarrier sound signal can be obtained is coupled to the signal source, characterized in that the second output impedance 3 is connected to the sound trap 4, 5 in such a way that the intercarrier sound signal is obtained from the sound trap 4, 5 and that the sound trap is so compensated for the tuned circuit losses which are also determined by the coupled second output impedance 3 that a maximum attenuation for the intercarrier sound signal is produced at the first output impedance 2.

Such circuit arrangements are particularly used for decoupling the video signal from the intercarrier sound signal in a television receiver, which only has one common IF demodulator for these two signals, which are consequently not already separated in the intermediate frequency range.

For this purpose a series resonant circuit could be included as a trap before the video output and the intercarrier signal could be taken off by means of some secondary windings of the resonant circuit coil. A parallel resonant circuit could also be included in the longitudinal branch and the intercarrier sound signal and the video signal respectively could be taken off before or behind it, preferably via additional filter members. Signal separation is here actually realized by the fact that a voltage divider is formed which comprises a resonant circuit in one branch. As, however, the intercarrier sound signal is taken from this resonant circuit, this circuit is in general considerably damped so that only a limited damping attenuation can be obtained for the undesired signal.

According to the invention a considerably improved signal separation can be obtained when the second output impedance is connected to the sound trap in such a way that the intercarrier sound signal is obtained from the sound trap, and that the sound trap is so compensated for the tuned circuit losses which are also determined by the coupled second output imepedance that a maximum attenuation for the intercarrier sound signal is produced at the first output impedance.

In this way a bridge circuit is formed in which a part of the voltage caused by the current of the signal source is so moved, by means of transformation, into the circuit of the first output impedance that another voltage, produced at an impedance by the signal source is compensated in magnitude and phase. In this way the sound trap is converted to a band filter without a real design effort; as the sound carrier signal is herein obtained from the sound trap itself; for example, from the current of a parallel resonant circuit, the second output impedance in this resonant circuit is made operative in such a way that it can be properly taken into account in the compensation of the tuned circuit losses so that a real attenuation peak can be obtained at the frequency of the intercarrier sound signal. In a further embodiment of the invention the intercarrier sound signal can be derived from a further resonant circuit, which is fed via an inductive coupling from the capacitive branch of the parallel sound trap or via a capacitive coupling of the inductive impedance of the series sound trap. As an additional feature, a high pass filter action and consequently a better suppression of the video frequencies at the sound signal output is obtained. By way of example the invention and its further embodiments will be further explained with reference to the drawing in which:

Figure 1:
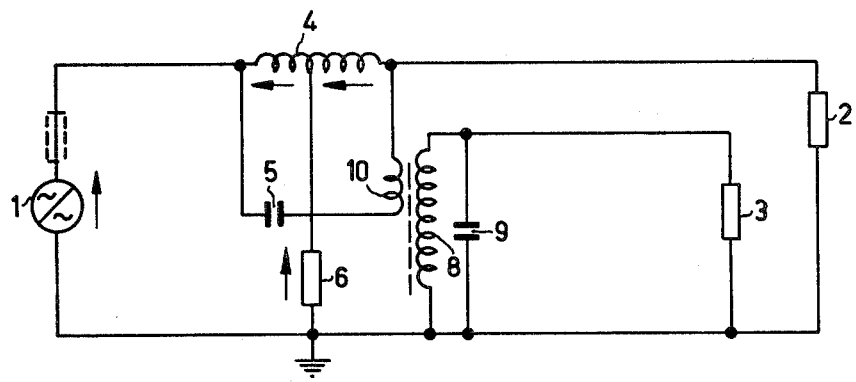
FIG. 1 is a circuit having a parallel resonant curcuit and tapped-off inductance.

In FIG. 1 a signal source 1, for example the demodulator of a television receiver supplies on the one hand the luminance signal which, may, for example, range from zero to 5 MHz and possibly a chrominance signal which is approximately in the same range, and also, on the other hand the narrow-band intercarrier sound signal having a carrier frequency of, for example 5.5 MHz. The internal resistance of the signal source 1 is shown by a dashed line. The video signal must be transferred to the "first" video output impedance 2 of, for example 2.2 KOhm, the (intercarrier) sound signal to the (second) sound output impedance 3 of also 2.2 KOhm. The relevant signal must be as free as possible from the other signal, in particular the sound signal must be attenuated at the video output impedance for 40 dB or more.

In a known circuit a sound trap is included for that purpose between signal source 1 and video output impedance 2, which sound tap consists of a longitudinal inductance 4 of approximately 7.5 $\mu$uH and a parallel capacitor 5 of 120 pF. This circuit is tuned to the sound carrier oscillation of 5.5 MHz. In this manner the sound voltage supplied by the signal source 1 is split in the ratio of the video output impedance 2 to the total impedance. When, according to one of the characteristics of the invention also the sound oscillations are derived from the resonant circuit 4,5 the quality is as a rule not so good so that the voltage division ratio is only limited.

Therefore, according to the invention the circuit is extended to form a bridge circuit in that to a tap, preferably the center tap of the inductance 4 an impedance 6 is connected into the other connecting wire between signal source 1 and video output resistor 2. The impedance 6 is essentially free from phase and amounts to approximately a quarter of the impedance $Z_{in}$ which is the impedance of the sound trap 4, 5 at the resonant frequency, for example 4.8 KOhm, the sound output impedance being coupled in one way or another to the sound trap. In this way it is obtained that the sound voltage of the signal source 1 is divided in two parts. One part going to the impedance 6 of 1.2 KOhm and the other one to that part of the sound trap 4, 5 which is situated between the centre tap of inductance 4 and its connection (shown on the left) to the signal source 1. Consequently these voltages have the same direction in the circuit going from the signal source via the impedance 6 and the sound trap 4, 5, which is indicated by arrows.

Owing to the tapped sound trap 4, 5 a corresponding component voltage is also activated in the circuit going from impedance 6 via the sound trap to the video output impedance 2, whilst the two voltage components which correspond with the sound signal and which are indicated by arrows, have opposite directions. As the resonant circuit impedance $Z_{in}$ forms in the resonant case practically an ohmic resistance and as the impedance 6 is also an ohmic resistance, it is ensured that the voltage components to the video output impedance 2 are equal, but opposite in magnitude and phase and cancel one another.

Figure 2:
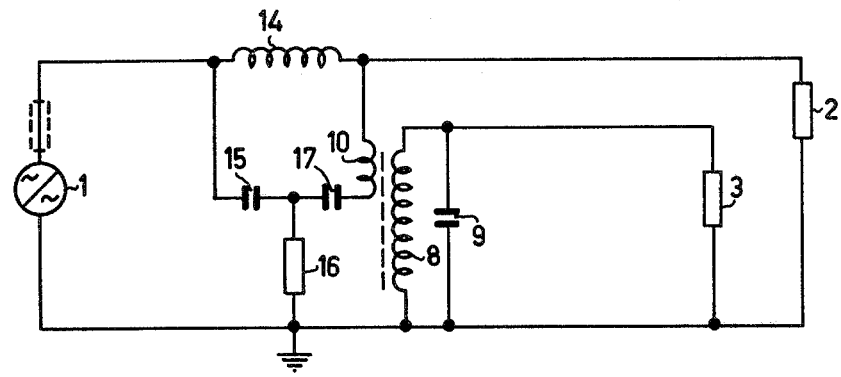
FIG. 2 is a circuit having a parallel resonant circuit and tapped-off capacitance.

FIG. 2 shows a highly equivalent circuit, in which the tapped inductance 4 is replaced by an inductance 14 without taps of approximately 7.5 $\mu$uH and in which the required centre tap is realized by substituting the resonant circuit capacitance 5 from FIG. 1 by the series arrangement of two capacitances, which are each about double as large and are each 220 pF; the complementary impedance 16 of 1.2 KOhm is then connected between the junction of the two capacitors 15 and 17 and the other, earthed conductor. Besides that, the circuits according to FIG. 1 and 2 correspond in operation.

Figure 3:
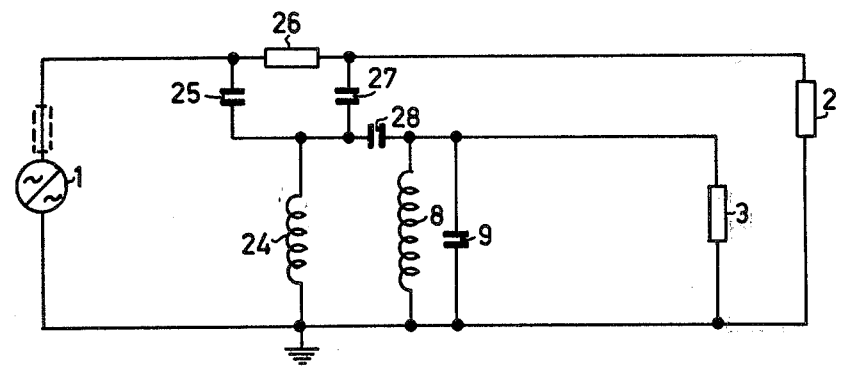
FIG. 3 is an approximately dual circuit diagram having a series resonant circuit and a split capacitance.

FIG. 3 shows an approximately similar circuit, in which the inductance 24 of approximately 16.8 $\mu$uH forms in series with two capacitors 25 and 27 of 22 pF each a series resonant circuit whilst the additional impedance which is required for the desired compensation and which is preferably an ohmic resistor of 82 ohm is connected between the other ends of capacitors 25 and 27 and, in an analogous manner, between the signal source 1 and the video impedance 2. The series resonant circuit 24, 25, 27 to which the video ouptut impedance 3 is connected in any arbitrary manner, represents in the resonant case an ohmic impedance which forms, with the impedance 26 a bridge T-element, which produces a zero transfer in the video branch at the resonant frequency.

In signal isolation networks of the kind underlying the invention the sound signal was derived from the resonant circuit via an inductive coupling, preferably via a parallel resonant circuit.

In a further embodiment of the invention the coupling may be chosen such, that for the sound signal travelling to impedance 3 an additional high pass filter action is produced. That is, that for low frequencies below the resonant frequency a considerably stronger attenuation occurs as for frequencies which are above the resonant frequency. The range beneath the resonant frequency is that range in which the video signal is situated; so this signal is additionally attenuated and kept far from the sound output. The blocking action is already considerably improved in the vicinity of the sound carrier, compared with a circuit in which the sound carrier oscillations are derived from the resonant circuit inductance.

For the oscillations above the sound carrier frequency an attenuation by means of this filter is less necessary as this frequency range is already attenuated to a higher degree in the preceding high frequency-intermediate frequency- amplifier owing to the channel separation.

Consequently, according to this further emdobiment of the invention in FIG. 1, the resonant circuit formed by the inductance 8 of, for example, 0.8 $\mu$uH and the capacitor 9 of, for example, 1 nF, which resonant circuit is connected to the lower circuit wire and which is tuned to the intercarrier sound carrier frequency, is connected to the capacitive branch of the sound trap circuit 4, 5 via a coupling coil 10 which forms a transformer with the coil 8. The abovementioned highpass characteristic is apparently obtained due to the fact that this branch behaves capacitively, so the current increases with the frequency. In FIG. 1 the sound output impedance 3 is connected parallel with the resonant circuit 8, 9, it can also be connected to a tap or in another manner, for example via a further band filter circuit.

Consequently this complete circuit according to FIG. 1 has, with a smaller number of circuit elements a proper decoupling of the signal ranges and it furthermore produces a direct current separation without an additional design effect.

In FIG. 2, the sound carrier- resonant circuit 8, 9 with connected sound-output impedance 3 is connected in a corresponding way to the capacitive branch of a sound trap circuit 14, 15, 17 via an inductive coupling coil 10 of, for example, 0.1 $\mu$uH.

In the embodiment according to FIG. 3 the desired highpass filter action is obtained in that the sound carrier-resonant circuit 9, 8 with connected sound-output impedance 3 is connected to the inductance 24 of the series resonant circuit 24, 25, 27 via a coupling capacity 28 of, for example 5.6 pF.

It is evident that in the embodiments to FIG. 1 to 3 the impedances which are induced by this coupling must also be taken into account when dimensioning and tuning the compensated sound trap circuit; in practice this causes no difficulties whatsoever.

What is claimed is:

1. A circuit arrangement for decoupling the video signal from an intercarrier sound signal in a television receiver, said circuit comprising an intermediate frequency source of video and sound signals, a sound trap coupled to said source and tuned to the intermediate frequency of the sound signal, a first output impedance from which the video signal can be obtained coupled to the a sound trap, a second output impedance from which the intercarrier sound signal can be obtained, means for coupling the second output impedance to the sound trap and for supplying the intercarrier sound signal from the sound trap to the second impedance, whereby losses are introduced into said sound trap thereby reducing the attenuation of said sound signal at said first output impedance, and means coupled to the sound trap for compensating for the losses, whereby a maximum attenuation for the intercarrier sound signal is produced at the first output impedance.

2. A circuit arragnement as claimed in claim 1, wherein the coupling means comprises a further resonant circuit and a reactive coupling coupled between said further resonant circuit and the branch of the sound trap having a reactance opposite in kind to that of said reactive coupling.

3. A circuit arrangement as claimed in claim 2, wherein said sound trap comprises a longitudinal branch having a parallel resonant circuit.

4. A circuit as claimed in claim 3, wherein said sound trap comprises an inductor having a tap, and said compensating means comprises a further impedance element having one end coupled to said tap and a second end coupled to said source and said first output impedance.

5. A circuit as claimed in claim 4, wherein said tap comprises a center tap, said further impedance element comprises a resistor having a value one quarter of the impedance of the sound trap at the resonant frequency with the coupled second output impedance, the inductance of said further resonant circuit being coupled to a capacitive branch of said sound trap.

6. A circuit as claimed in claim 3, wherein the sound trap comprises two series coupled capacitors having a junction point, and said compensating means comprises a further impedance element having one end coupled to said junction point and a second end coupled to said source and said first output impedance.

7. A circuit as claimed in claim 6 wherein said series capacitors are equal and said further impedance element comprises a resistor having a value of one quarter of the impedance at the resonant frequency of said trap with said coupled second output impedance, the inductance of said further resonant circuit being coupled to one of said series capacitors.

8. A circuit arrangement as claimed in claim 2, wherein said sound trap comprises a transverse branch having a series resonant circuit.

9. A circuit as claimed in claim 8 wherein said trap comprises a longitudinal branch including said compensating means, said means comprising a longitudinal impedance element having one end coupled to said source and a second end coupled to said first output impedance, two series coupled capacitors coupled to said ends and having a junction point, and an inductance coupled to said junction point and said source and said first output impedance.

10. A circuit as claimed in claim 9, wherein said capacitors are equal, and said longitudinal impedance comprises a resistor having a value four times the impedance at the resonant frequency of said trap with said coupled further resonant circuit, said reactive coupling being a capacitor.

* * * * *